(12) United States Patent
Kostakis et al.

(10) Patent No.: US 9,229,048 B2
(45) Date of Patent: Jan. 5, 2016

(54) DEVICES AND METHODS FOR PROVIDING AN IMPULSE CIRCUIT

(71) Applicant: Raycap Intellectual Property Ltd., Nicosia (CY)

(72) Inventors: Grigoris Kostakis, Athens (GR); Evaggelia Giannelaki, Drama (GR); Thomas Tsovilis, Drama (GR); Zafiris Politis, Athens (GR)

(73) Assignee: Raycap Intellectual Property Ltd., Nicosia (CY)

( * ) Notice: Subject to any disclaimer, the term of this patent is extended or adjusted under 35 U.S.C. 154(b) by 340 days.

(21) Appl. No.: 14/024,690

(22) Filed: Sep. 12, 2013

(65) Prior Publication Data

US 2015/0061692 A1    Mar. 5, 2015

(30) Foreign Application Priority Data

Aug. 30, 2013  (GR) ............................ 20130100490

(51) Int. Cl.

| | |
|---|---|
| *G01R 31/02* | (2006.01) |
| *G01R 31/08* | (2006.01) |
| *H02H 3/20* | (2006.01) |
| *H02H 9/04* | (2006.01) |
| *H02H 3/00* | (2006.01) |
| *G01R 31/28* | (2006.01) |
| *H02H 9/02* | (2006.01) |
| *H02H 3/093* | (2006.01) |
| *H03K 17/082* | (2006.01) |
| *G01R 31/00* | (2006.01) |

(52) U.S. Cl.
CPC .......... *G01R 31/2827* (2013.01); *G01R 31/001* (2013.01); *H02H 3/093* (2013.01); *H02H 9/021* (2013.01); *H03K 17/0824* (2013.01)

(58) Field of Classification Search
CPC .. G01R 31/2827; G01R 31/001; H02H 3/093; H02H 3/027; H02H 9/021; H03K 17/0824
USPC .................. 324/537, 522; 361/91.1, 91.8, 94
See application file for complete search history.

(56) References Cited

U.S. PATENT DOCUMENTS

| | | | | |
|---|---|---|---|---|
| 5,537,044 | A * | 7/1996 | Stahl | G01R 31/14 307/107 |
| 6,407,539 | B1 | 6/2002 | Struck et al. | |
| 6,411,482 | B1 * | 6/2002 | Funke | H02H 3/048 361/58 |
| 6,798,211 | B1 | 9/2004 | Rockwell et al. | |

OTHER PUBLICATIONS

Surge Generators, Sebakmt UK, http://www.sebakmtuk.com/surge-generators/217-surge-generators, 2013.

* cited by examiner

*Primary Examiner* — Amy He
(74) *Attorney, Agent, or Firm* — Myers Bigel Sibley & Sajovec, P.A.

(57) ABSTRACT

Devices include an impulse current generator that is configured to provide a direct impulse current (DIC) that includes a specified waveform to a test load during a test duration, a continuous power supply that is configured to provide a continuous power to the test load during the test duration, a trigger circuit that is configured to determine a trigger condition that corresponds to the DIC and to generate a trigger signal responsive to determining the trigger condition, and a current bypass circuit that is configured to receive the trigger signal generated by the trigger circuit and to conduct a majority portion of the DIC being conducted by the load responsive to the trigger signal.

24 Claims, 9 Drawing Sheets

DEVICES AND METHODS FOR PROVIDING AN IMPULSE CIRCUIT

CROSS REFERENCE TO RELATED APPLICATIONS

This U.S. non-provisional patent application claims the benefit of priority under 35 U.S.C. §119 of Greek Patent Application No. 20130100490; filed Aug. 30, 2013, the entire disclosure of which is hereby incorporated herein by reference in its entirety.

FIELD OF THE INVENTION

The present invention relates to device testing and, more particularly, to devices and methods for testing protection devices.

BACKGROUND

Frequently, excessive voltage or current is applied across service lines that deliver power to residences and commercial and institutional facilities. Such excess voltage or current spikes (transient overvoltages and surge currents) may result from lightning strikes, for example. The above events may be of particular concern in telecommunications distribution centers, hospitals and other facilities where equipment damage caused by overvoltages and/or current surges and resulting down time may be very costly.

Typically, sensitive electronic equipment may be protected against transient overvoltages and surge currents using Surge Protective Devices (SPDs). Since SPDs may be relied upon to protect sensitive and potentially costly electronic equipment, manufacturers of such devices may perform stringent performance testing on SPDs using one or more testing regimens. For example, high current generators may be used to produce current waveforms in order to experimentally simulate lightning related surges.

Some testing standards have determined specific current curves for simulating a surge event, such as, for example, a lightning strike. An example international testing standard includes IEC 61643-11 "Additional duty test for test Class I" for SPDs (Clause 8.3.4.4) based on the impulse discharge current waveform defined in Clause 8.1.1 of IEC 61643-11, typically referred to as 10/350 microsecond ("µs") current waveform ("10/350 µs current waveform"). For example, brief reference is made to FIG. 1, which is a plot illustrating the 10/350 µs waveform. The 10/350 µs current waveform may characterize a current wave in which the maximum current (100%) is reached at about 10 µs and the current is 50% of the maximum at about 350 µs. Under 10/350 µs current waveform, the transferred charge, Q, and specific energy, W/R, to SPDs should be related with peak current according to one or more standards. For example, the IEC 61643-11 parameters to Class I SPD test are illustrated in Table 1, which follows:

TABLE 1

Parameters for Class I SPD Test

| $I_{imp}$ within 50 µs (kA) | Q within 5 ms (As) | W/R within 5 ms (kJ/Ω) |
|---|---|---|
| 25 | 12.5 | 156 |
| 20 | 10 | 100 |
| 12.5 | 6.25 | 39 |
| 10 | 5 | 25 |

TABLE 1-continued

Parameters for Class I SPD Test

| $I_{imp}$ within 50 µs (kA) | Q within 5 ms (As) | W/R within 5 ms (kJ/Ω) |
|---|---|---|
| 5 | 2.5 | 6.25 |
| 2 | 1 | 1 |
| 1 | 0.5 | 0.25 |

However, the required Q and W/R can be achieved within a time interval several times lower than that corresponding to a zero impulse current flow.

Conventionally, high current may be produced by the discharge of capacitors through an RL circuit. In order to obtain unidirectional current, critical and/or overcritical damping of the RLC circuit may be used and may be achieved by using a damping resistance R≥2 $(LC)^{0.5}$. For example, brief reference is made to FIG. 2, which is a graph that illustrates current waveforms. A critically damped RLC circuit may be represented by curves "a" and "b" illustrated therein. Higher peak currents for the same generator energy can be achieved by an undercritical damping circuit (R<2$(LC)^{0.5}$). However, as illustrated by curve "c", the current waveform may be oscillatory. In order to get an unidirectional current a crowbar device may be used, usually in conjunction with a controllable three electrode gap, ignited at the instant of the crest value of the current so as to achieve a non-oscillating waveform, such as shown in curve "d". Such crowbar devices may be successful at producing current waveforms according to one or more testing standards. However, such devices may require calibration and synchronization for different types of varistor based SPDs. Because they may be configured to trigger at the peak current. As such a different generator may be used for each type of SPD.

Additionally, the application of greater Q and W/R than is specified in the test standard may result in excessive electrical and thermal stress on the SPD being tested. For example, the SPD being tested may experience excessive electrical and mechanical stress corresponding to the 'tail' of the 10/350 µs waveform. Such stress may be particularly critical regarding the performance of varistors.

SUMMARY

Devices according to embodiments of the present invention may include an impulse current generator that is configured to provide a direct impulse current (DIC) (discharge of capacitors through an RL circuit) that includes a specified waveform to a test load during a test duration, a continuous power supply that is configured to provide a continuous power to the test load during the test duration, a trigger circuit that is configured to determine a trigger condition that corresponds to the DIC and to generate a trigger signal responsive to determining the trigger condition, and a current bypass circuit that is configured to receive the trigger signal generated by the trigger circuit and to conduct a majority portion of the DIC being conducted by the load responsive to the trigger signal.

In some embodiments, the specified waveform is a 10/350 microsecond current waveform.

Some embodiments provide that the current bypass circuit includes a thyristor that includes a gate that is coupled to the trigger circuit and that is configured to receive the trigger signal. Some embodiments provide that the trigger condition corresponds to a given time after the DIC is generated. In some embodiments, the given time is in a range of about 1.0 ms to about 3.0 ms. Some embodiments provide that the given time is in a range of about 1.8 ms to about 2.3 ms. In some embodiments, the given time is about 2.0 ms.

Some embodiments provide that the test load includes a surge protection device and that a maximum value of the DIC is greater than about 1000 amperes. In some embodiments, the surge protection device includes a metal oxide varistor.

Some embodiments provide that the trigger circuit is further configured to determine the trigger condition based on a voltage across the test load. In some embodiments, the trigger circuit may estimate the voltage developed across the test load that exceeds a threshold voltage, a time delay control configured to generate an elapsed time signal after the residual voltage has exceeded the threshold voltage for a given time delay, and a voltage pulse generator that is configured to generate a voltage pulse that is received by the current bypass circuit as the trigger signal.

Some embodiments include a blocking diode between the impulse current generator and the test load to block current generated by the continuous current supply from conducting through the impulse current generator. Some embodiments include a current rate limiter that is connected in series with the current bypass circuit and that is configured to limit the rate of change of current flowing through the current bypass circuit and a voltage rate limiter that is connected in parallel with the current bypass circuit and that is configured to limit the rate of a voltage rise across the current bypass circuit.

Some embodiments of the present invention are directed to methods for testing a surge protection device. Such methods may include applying a substantially continuous power to the surge protection device during a test duration, generating a direct impulse current (DIC) that corresponds to a specified waveform and applying the DIC to the surge protection device, generating a trigger signal responsive to a trigger condition that corresponds to a time duration of the DIC applied to the surge protection device, and conducting a majority portion of the DIC to bypass the surge protection device in response to generating the trigger signal.

In some embodiments, the specified waveform is a 10/350 microsecond current waveform. Some embodiments provide that the time duration is in a range of about 1.0 ms to about 3.0 ms.

Some embodiments provide that the surge protection device includes a metal oxide varistor and a maximum value of the DIC is greater than about 1000 amperes. Some embodiments provide that the time duration of the DIC applied to the surge protection device is initiated by a voltage across the surge protection device exceeding a voltage threshold.

Some embodiments include blocking current generated by a continuous current supply from conducting through an impulse current generator. Yet further embodiments include limiting a rate of change of current flowing through a current bypass circuit and limiting a rate of a voltage rise across the current bypass circuit.

Some embodiments of the present invention are directed to devices that include a crowbar circuit connected in parallel with a test load. The crowbar circuit may be configured to conduct a DIC at a given time after the DIC is applied to the test load. Some embodiments provide that the crowbar circuit includes a thyristor that includes a gate and that is configured to conduct the DIC at the given time responsive to a trigger signal being applied to the gate, a trigger circuit that is configured to sense a voltage across the thyristor and to generate the trigger signal to be received at the gate of the thyristor, a first blocking diode that is connected between the thyristor and the test load and that is configured to block alternating current (AC) voltage from conducting through the crowbar circuit, and a second blocking diode that is connected in series with the thyristor and that is configured to block a recharging current to impulse current generator capacitors during a discharge of the impulse current.

In some embodiments, the crowbar circuit includes a current rate limiter that is connected in series with the thyristor and that is configured to limit the rate of change of current flowing through the thyristor and a voltage rate limiter that is connected in parallel with the thyristor and that is configured to limit the rate of a voltage rise across the thyristor. In some embodiments, the test load includes a metal oxide varistor and a maximum value of the DIC is greater than about 1000 amperes.

Some embodiments provide that the trigger circuit is configured to estimate a voltage that develops across the thyristor and that exceeds a threshold voltage. The trigger circuit may include a time delay control configured to generate an elapsed time signal after the residual voltage has exceeded the threshold voltage for a given time delay and a voltage pulse generator that is configured to generate a voltage pulse that is received by the thyristor as the trigger signal.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION

Figure 1:
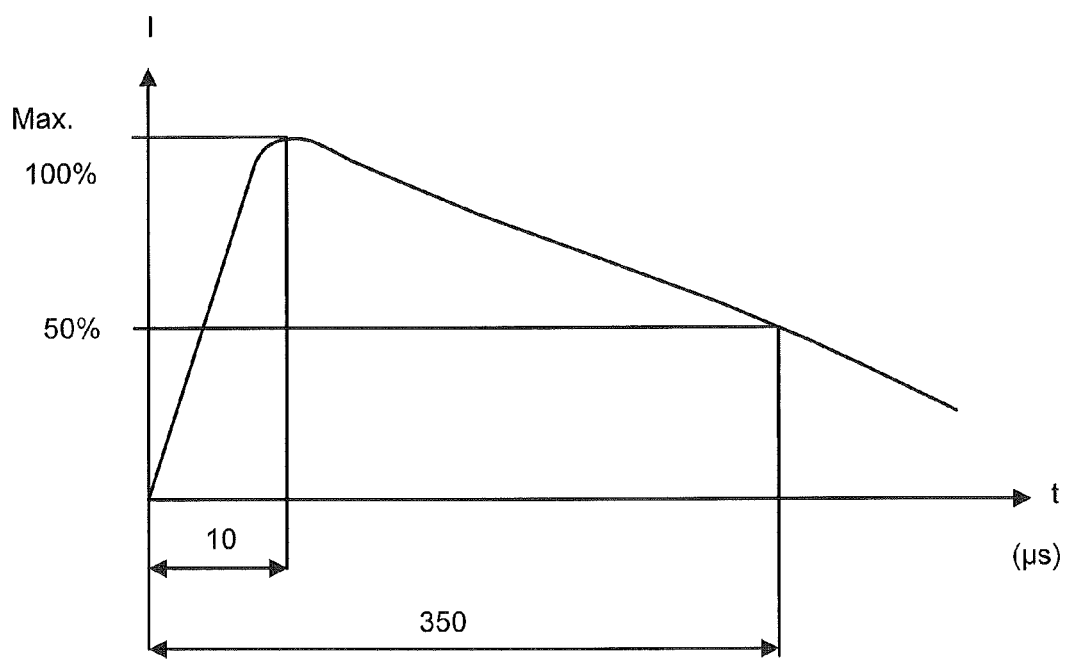
FIG. 1 is a plot illustrating a conventional 10/350 µs current waveform used for approximating surges.
Figure 2:
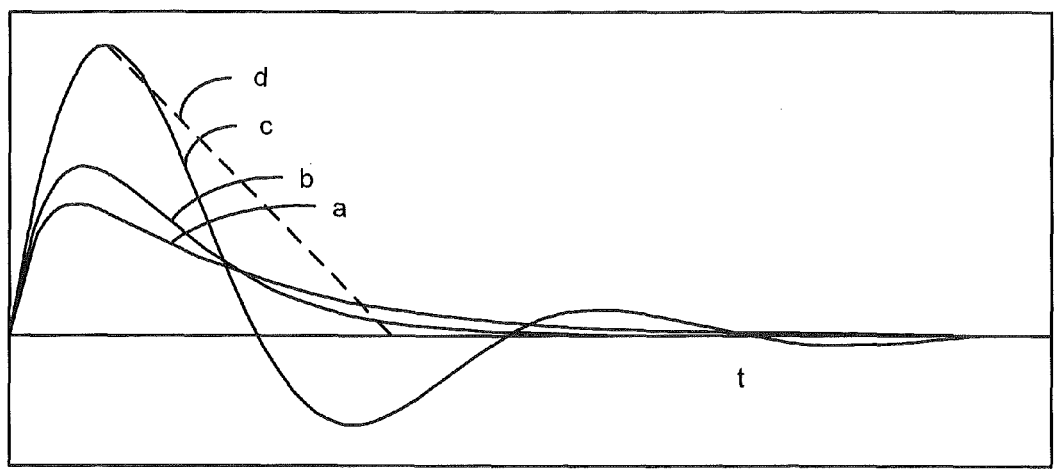
FIG. 2 is a plot illustrating 10/350 µs current waveforms produced by critical, overcritical, undercritical and a generator with a crowbar circuit.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As disclosed herein, a novel crowbar circuit is introduced which may bypass the generated impulse current from a test device, such as a surge protection device (SPD), after the Q and W/R defined under one or more test standards is applied. In this manner, excessive electrical and thermal stress on SPDs may be avoided. Some embodiments provide that this may be important in that the latter stress may be critical for the performance of varistors. Additionally, embodiments described herein may avoid the requisite calibration corresponding to conventional crowbar devices.

Simulation and experimental results for high current generators have shown that the limiting values of charge and the specific energy transferred to Class I SPDs under 10/350 µs according to IEC 61643-11 standard can be achieved within about 2.0 ms. Thus, some embodiments of a crowbar circuit according to the present invention have been developed and incorporated into high current generators. The crowbar circuits may short the capacitor bank about 2.0 ms after the application of the impulse current waveform. In that manner, the SPD may be tested according to IEC standard in terms of peak value, charge transfer and specific energy without excessive electrical and thermal stress on the SPD.

Figure 3:
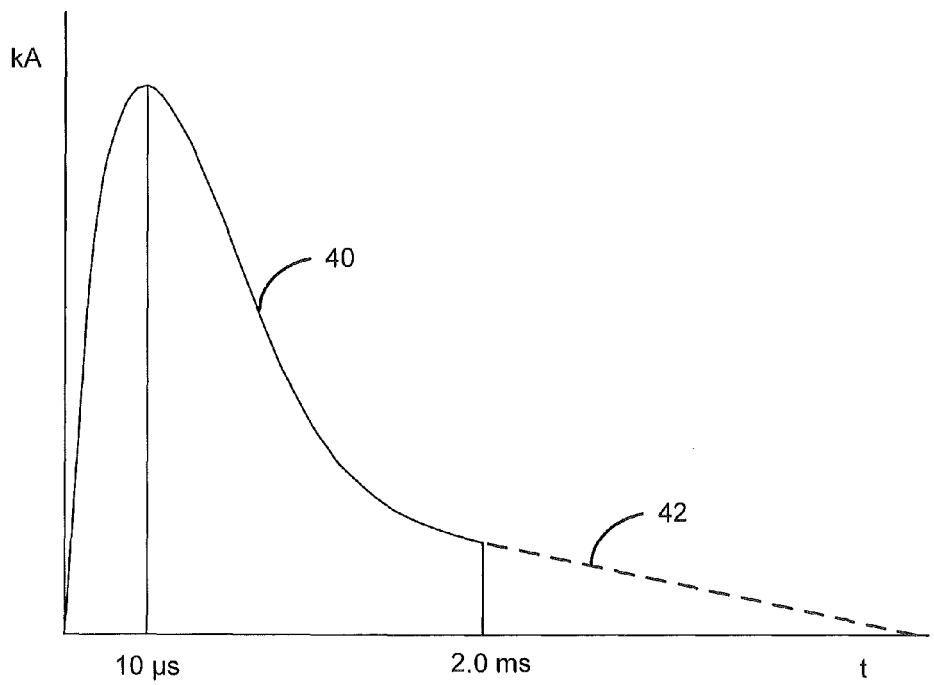
FIG. 3 is a plot of a 10/350 µs current waveform and a current waveform generated by a crowbar device that is triggered according to some embodiments of the present invention.

As disclosed herein, some embodiments of a crowbar device herein may activate at a given time after the current begins flowing through the SPD. In some embodiments, the time may be pre-specified and the time period may begin based on one or more circuit conditions. After the elapsed time, the impulse current may bypass the SPD by flowing through a thyristor or other switchable conducting device. In this manner, the impulse current may flow through SPD until the defined Q and W/R are provided and then the remaining part of the impulse current may flow through crowbar device. For example, brief reference is now made to FIG. 3, which is a plot of a 10/350 µs current waveform and a current waveform generated by a crowbar device that is triggered according to some embodiments of the present invention. As illustrated, the SPD impulse current 40 (solid line) flows through the SPD until the crowbar circuit activates. The bypassed impulse current 42 (dashed line) flows through the crowbar circuit once the crowbar circuit is activated. The plot also illustrates the time at which the crowbar circuit according to some embodiments of the present invention may trigger, namely, about 2.0 milliseconds (ms). In contrast, circuits of the prior art may typically trigger around the peak current, such as around 10 microseconds (µsec), which may require significant calibration to be used on different devices and/or device types.

Figure 4:
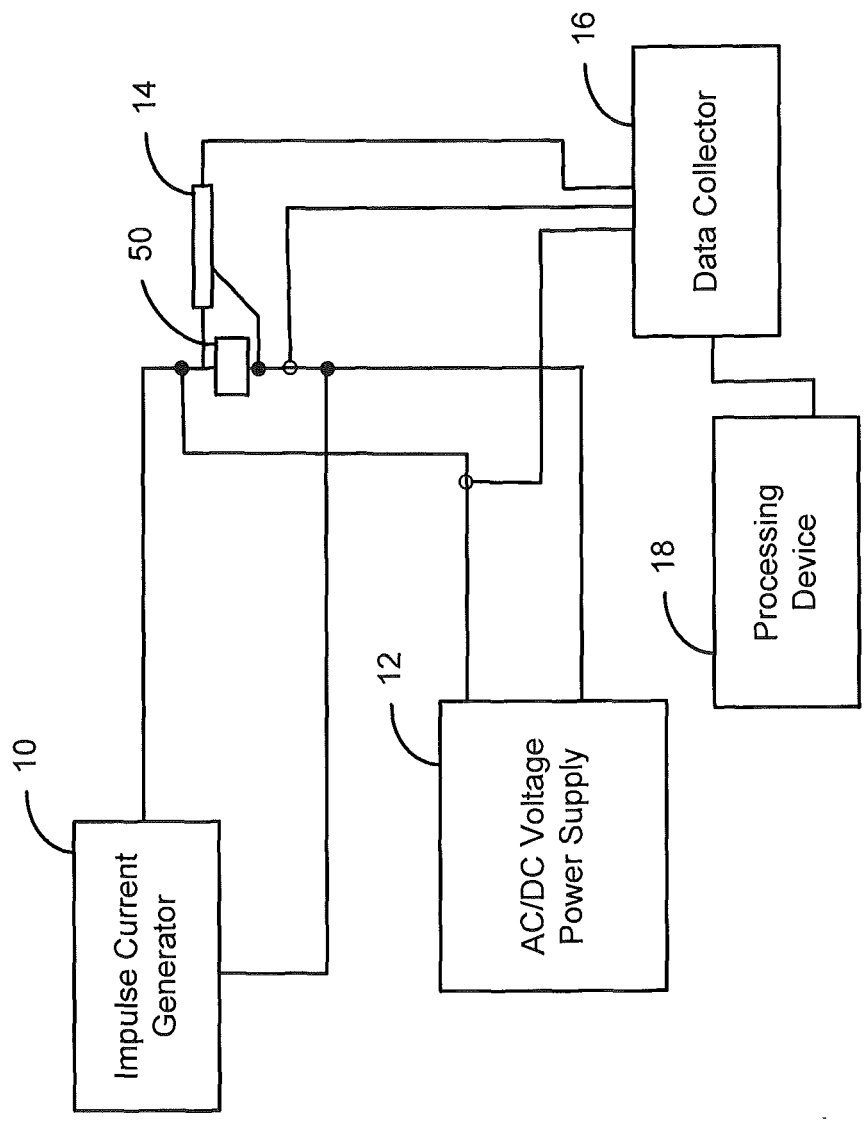
FIG. 4 is a block diagram illustrating a conventional system for testing surge protection devices.

Brief reference is made to FIG. 4, which is a block diagram illustrating a conventional system for testing surge protection devices. The system includes an impulse current generator 10 that is configured to deliver an impulse current to a test load 50. An continuous power supply 12 is configured to provide a substantially continuous voltage across the test load 50 during the testing process. Some embodiments provide that the continuous power supply 12 may be AC, DC and/or AC/DC. A probe 14, such as a high voltage probe, may be connected across the test load and may generate probe signals corresponding to the voltage across the test load 50. A data collector 16 may receive the probe signals from the probe 14 and collect, format, and/or store the collected data, which may be further received and analyzed using a processing device 18. Some embodiments provide that the data collector may be, for example, an oscilloscope. The processing device 18 may include any of a number of different processing devices such as mobile and/or stationary computers, among others.

Figure 5:
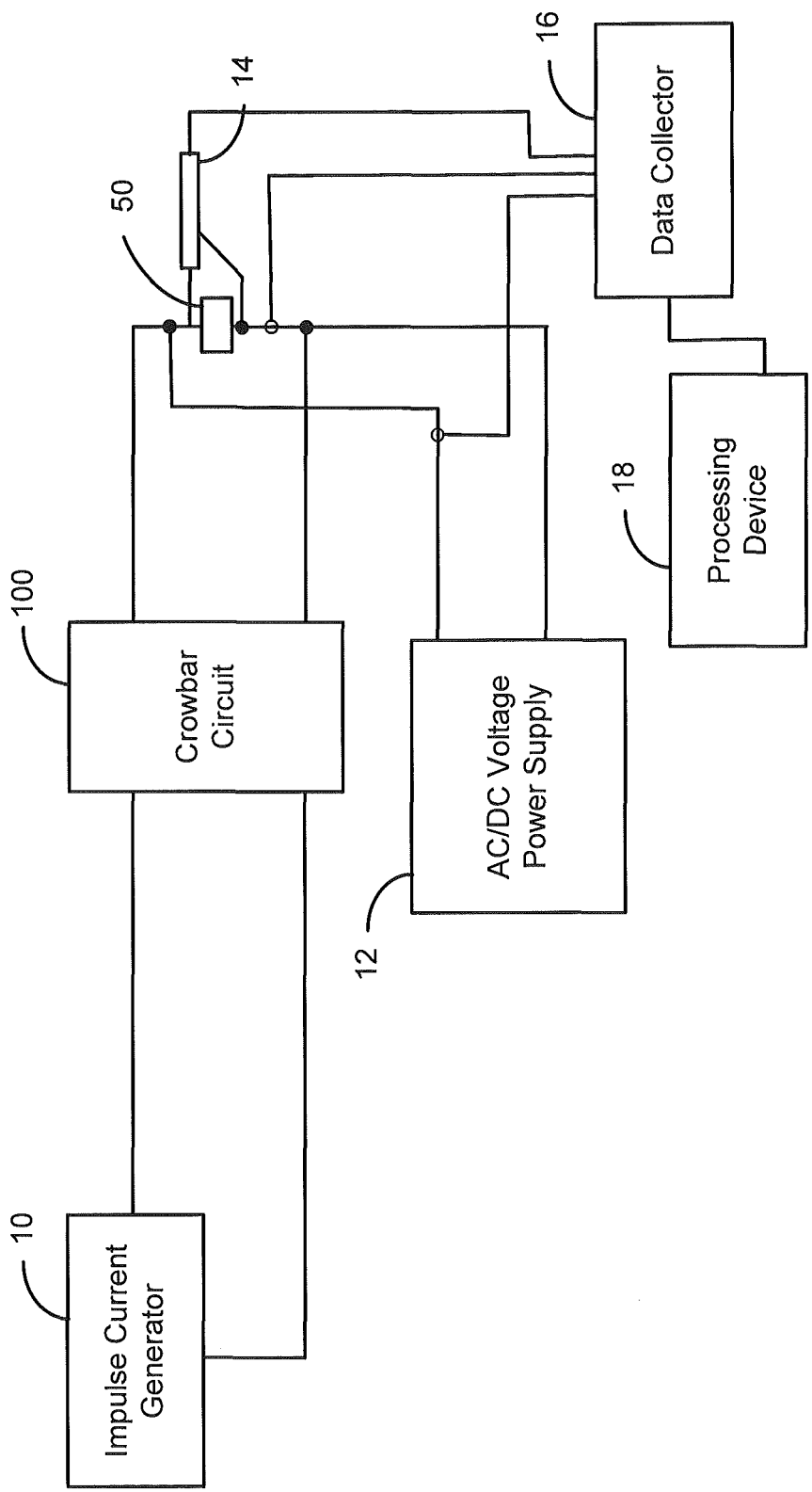
FIG. 5 is a block diagram illustrating a system for testing surge protection devices according to some embodiments of the present invention.

Reference is now made to FIG. 5, which is a block diagram illustrating a system for testing surge protection devices according to some embodiments of the present invention. In addition to the elements described above regarding FIG. 4, the repeated description of which will be omitted herein, the system according to some embodiments includes a crowbar circuit 100 connected between the impulse current generator 10 and the test load 50.

Figure 6:
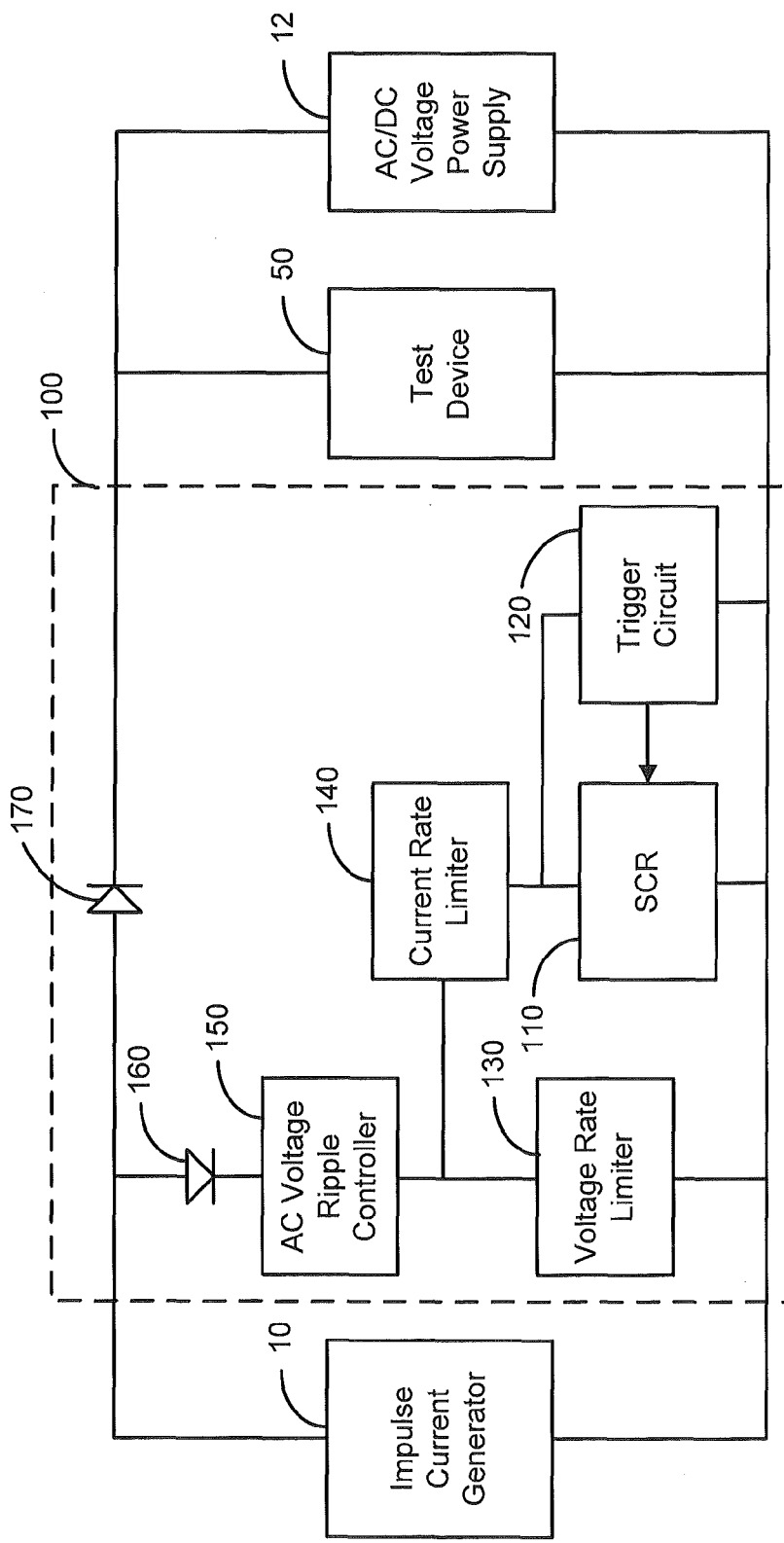
FIG. 6 is a block diagram illustrating a system for testing surge protection devices according to some embodiments of the present invention.

Reference is now made to FIG. 6, which is a block diagram illustrating a system for testing surge protection devices according to some embodiments of the present invention. Although described as a system in some embodiments, one or more of the components disclosed herein may be combined in to a single device that provides multiple functionality. In some embodiments, the system may include an impulse current generator 10 that is configured to provide a direct impulse current (DIC) that includes a specified waveform to a test device 50 during a test duration. Some embodiments provide that the test device 50 may include a SPD, including but not limited to a metal oxide varistor, among others. As used herein, the test device 50 may also be referred to as a test load such that the terms may be used interchangeably herein. Some embodiments provide that a maximum value of the DIC is greater than about 1000 amperes (1 kA). For example, a maximum current may be about 2 kA, 5 kA, 10 kA, 12.5 kA, 20 kA and/or 25 kA, among others. The specified waveform current may be is a 10/350 microsecond current waveform, however, the invention is not so limited. For example, embodiments disclosed herein may be used in conjunction with a 8/20 microsecond current waveform (as defined in Clause 8.1.2 of IEC 61643-11), among others.

A continuous power supply 12 may be configured to provide a substantially continuous power to the test device 50 during the test duration. Some embodiments provide that the continuous power supply 12 is an AC voltage power supply. Some embodiments provide that the continuous power supply 12 may be AC, DC and/or AC/DC. As described below, the AC power voltage is not shorted via the crowbar device 100 and may be continuously applied to the test device 50 during testing.

Portions of the system may be characterized as the crowbar device 100 as described above. For example, a trigger circuit 120 may be configured to determine a trigger condition that corresponds to the DIC and to generate a trigger signal in response to determining the trigger condition. In some embodiments, the trigger condition corresponds to a given time after the DIC is generated while some embodiments provide that the trigger condition is a given time after a specified voltage is detected across the test device 50 or another circuit element. In some embodiments, the given time is in a range of about 1.0 ms to about 3.0 ms, whereas some embodiments provide that the given time is in a range of about 1.8 ms to about 2.3 ms. In some embodiments, the given time is about 2.0 ms.

Some embodiments provide that the trigger circuit 120 is configured to determine the trigger condition based on a voltage across the test device 50 whereas in some other embodiments the trigger circuit 120 determines the trigger condition based on a voltage across a current bypass device, such as a Silicon Controlled Rectifier (SCR) 110.

Figure 7:
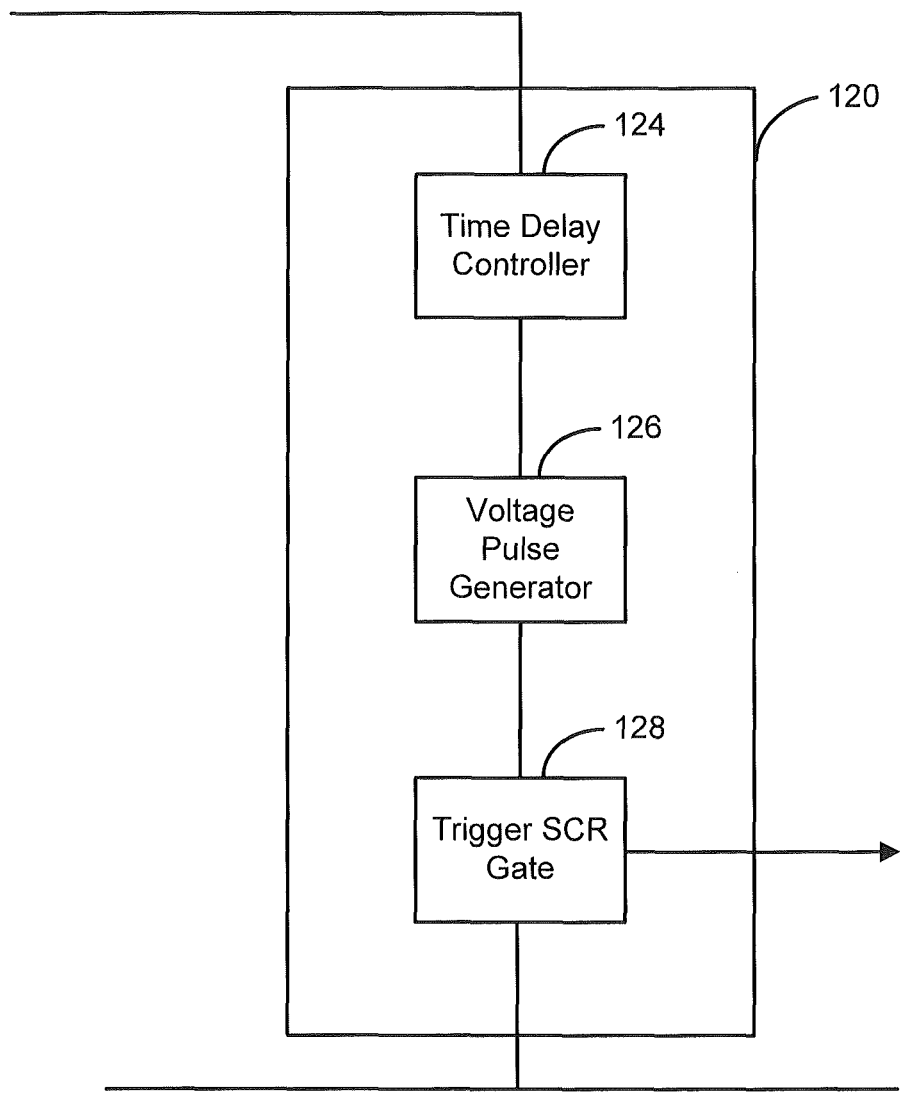
FIG. 7 is a block diagram illustrating a trigger circuit according to some embodiments of the present invention.

Brief reference is made to FIG. 7, which is a block diagram illustrating a trigger circuit according to some embodiments of the present invention. In some embodiments, the trigger circuit 120 is configured to determine that a residual voltage across the test load exceeds a threshold voltage. Although not illustrated, the trigger circuit 120 may include a voltage sensor configured to estimate a residual voltage across the thyristor that exceeds a threshold voltage. Some embodiments provide that the threshold voltage is given while other embodiments provide that a user may input a threshold voltage value. A time delay controller 124 is configured to generate an elapsed time signal after the application of the impulse current. The time of application of the impulse current may be detected when the residual voltage exceeds the threshold voltage. In some embodiments, the impulse current may be detected using a current sensor. The elapsed time may be based on a given time delay that is fixed and/or may include a time delay that, may be adjusted and/or provided by a user and/or other data source. A voltage pulse generator 126 may generate a voltage pulse once the time delay is elapsed. The voltage pulse may be used to trigger 128 the SCR 110.

Referring again to FIG. 6, a current bypass circuit, such as a silicon controlled rectifier (SCR) 110 may be configured to receive the trigger signal generated by the trigger circuit 120 and to conduct a majority portion of the DIC being conducted by the test device 50 responsive to receiving the trigger signal. Some embodiments provide that SCR 110 is a thyristor that includes a gate that is coupled to the trigger circuit 120 and that is configured to receive the trigger signal.

Some embodiments further include a blocking diode 170 connected between the impulse current generator 10 and the test device 50 to block current generated by the continuous power supply 12 from conducting through the impulse current generator 10 or the crowbar circuit 100. Some embodiments provide that the continuous current supply 12 may be AC, DC and/or AC/DC. In some embodiments, a blocking diode 160 may block the flow of AC current from the continuous power supply 12 to the crowbar circuit 100. The blocking diodes 160 and 170 may be selected to function while conducting impulse and/or surge currents having peak values of several thousand Amperes. A current rate limiter 140 may be connected in series with the SCR 110 and that may limit the rate of change of current flowing through the SCR 110. The current rate limiter may include an inductor that is operable to slow the rate of change in current through the SCR 110 to protect the SCR 110.

Some embodiments provide that a voltage rate limiter 130 may be connected in parallel with the SCR 110 and may limit the rate of a voltage rise across the SCR 110. In some embodiments, the voltage rate limiter 130 may include a resistive-capacitive (RC) circuit that is operable to slow the rise in voltage across the SCR 110 to protect the SCR 110 from failing by short circuiting without a trigger signal applied to the gate.

Figure 8:
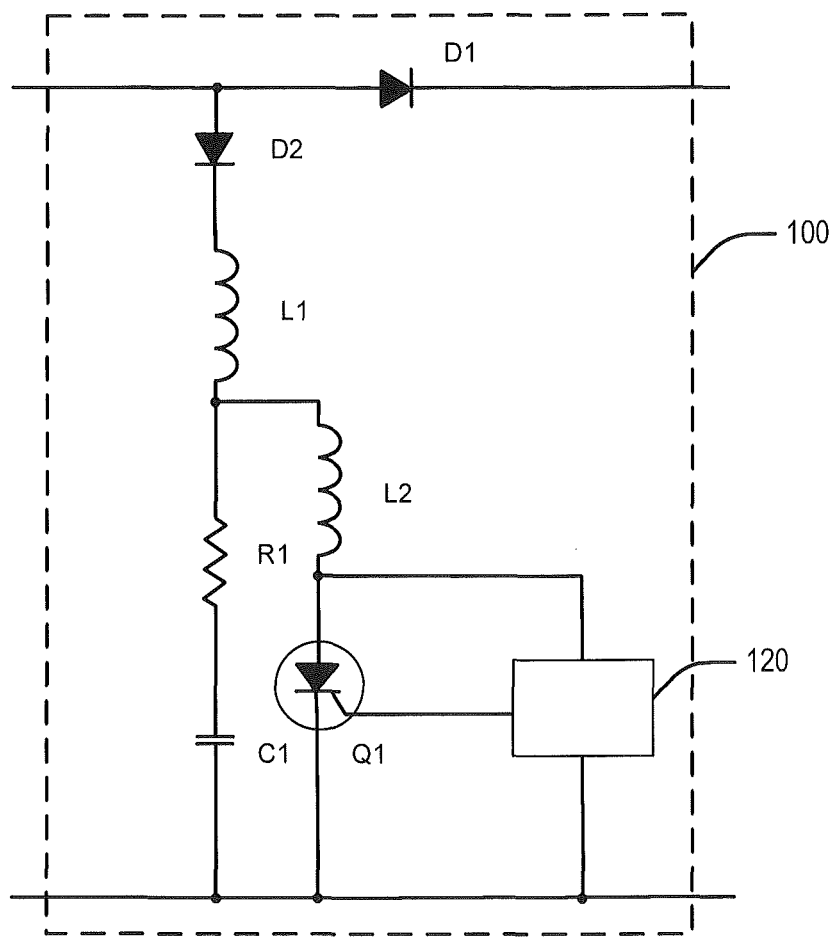
FIG. 8 is a schematic diagram representing a circuit of a crowbar circuit in a system for testing surge protection as illustrated in FIGS. 5 and 6.

Reference is now made to FIG. 8, which is a schematic diagram representing a circuit of a crowbar circuit in a system for testing surge protection as illustrated in FIGS. 5 and 6. As discussed above, the crowbar circuit 100 may be incorporated into a current generator and may short a capacitor bank therein at a given time interval after the application of the impulse current waveform. For example, some embodiments provide that the given time interval is 2.0 ms after the application of the impulse current waveform, however, such embodiments are non-limiting. For example, the given time period may be longer or shorter than 2.0 ms. In this manner, the test device 50 may be tested according to one or more standards (e.g., IEC standards) in terms of peak value, charge transfer and/or specific energy, while avoiding excessive electrical and thermal stress on the test device 50.

Upon application of the impulse current, before the given time interval elapses, the impulse current flows through the test device 50. After the given time interval elapses, which may correspond to the satisfaction of the defined Q and W/R, the remaining impulse current may flow through the crowbar device 100.

In use and operation, the crowbar circuit 100 may include a thyristor SCR (Q1), which may be triggered to an on-state (conducting) at a specified time. For example, still referring to FIG. 8, the crowbar circuit 100 includes input terminals 11 and 12 to which an impulse current generator is connected. The crowbar circuit 100 may include terminals 13 and 14, which are load terminals that may be connected to an AC power supply 12 and the test device 50.

Some embodiments provide that the thyristor SCR Q1 may have a performance characteristic that defines a maximum rate of change of voltage (dv/dt) applied to the thyristor SCR Q1. In such embodiments, the thyristor SCR Q1 may self-trigger into a conduction mode if the dv/dt rating is exceeded. As such, some embodiments provide that a voltage rate change limiter, which may include a snubber circuit connected in parallel with the thyristor SCR Q1 and an inductance (L1) in series with the parallel combination of the SCR and the snubber circuit. In some embodiments, the snubber circuit may include a resistor R1 in series with a capacitor C1. Some embodiments provide that the resistor R1 may function to limit the discharge current via the capacitor C1 during the short circuit of the thyristor SCR Q1 to an acceptable level so as to prevent failure of the equipment. Some non-limiting embodiments provide that L1 may have an inductance value of about 9 µH, however, some embodiments may provide that the inductance is more or less than 9 µH.

In some embodiments, the time derivative of current (di/dt) through the thyristor SCR Q1 may be limited to a value of rated maximum by an inductive element L2. Inductor L2 may be installed in series with the Q1. Some non-limiting embodiments provide that L2 may have an inductance value of about 320 µH, however, the inductance may be more or less than about 320 µH. Some embodiments provide that diodes D1 and D2 block the flow of AC current from the power source to the crowbar device. In some embodiments, diodes D1 and D2 may be selected so as to withstand impulse and surge currents of peak values of several kA.

An inductor L1 may be used to control a voltage ripple corresponding to the AC voltage that is applied to the test device 50.

In some embodiments, a thyristor SCR Q1 may include a phase control thyristor that may provide high repetitive peak forward off-state and reverse voltages. For example, in some embodiments, the maximum peak forward off-state voltage that can be applied to the thyristor is around 5 kV. However, such embodiments are non-limiting as the thyristor may be able to withstand a substantially greater peak forward off-state voltage, such as, for example, 6 kV or more. In this manner, the thyristor may withstand at least 6 kV peak forward off-state voltage in order not to turn-on at the wrong instant or get damaged. According to some embodiments, the thyristor may demonstrate high performance at surge currents.

A trigger circuit 120 may sense the voltage developed across the terminals of the test device 50 and, after a certain period of time, may generate a voltage impulse to the gate of the thyristor SCR Q1. Responsive to the voltage impulse at the gate, the thyristor SCR Q1 switches to an on-state (conducting) to bypass the impulse current from the test device 50.

Figure 9:
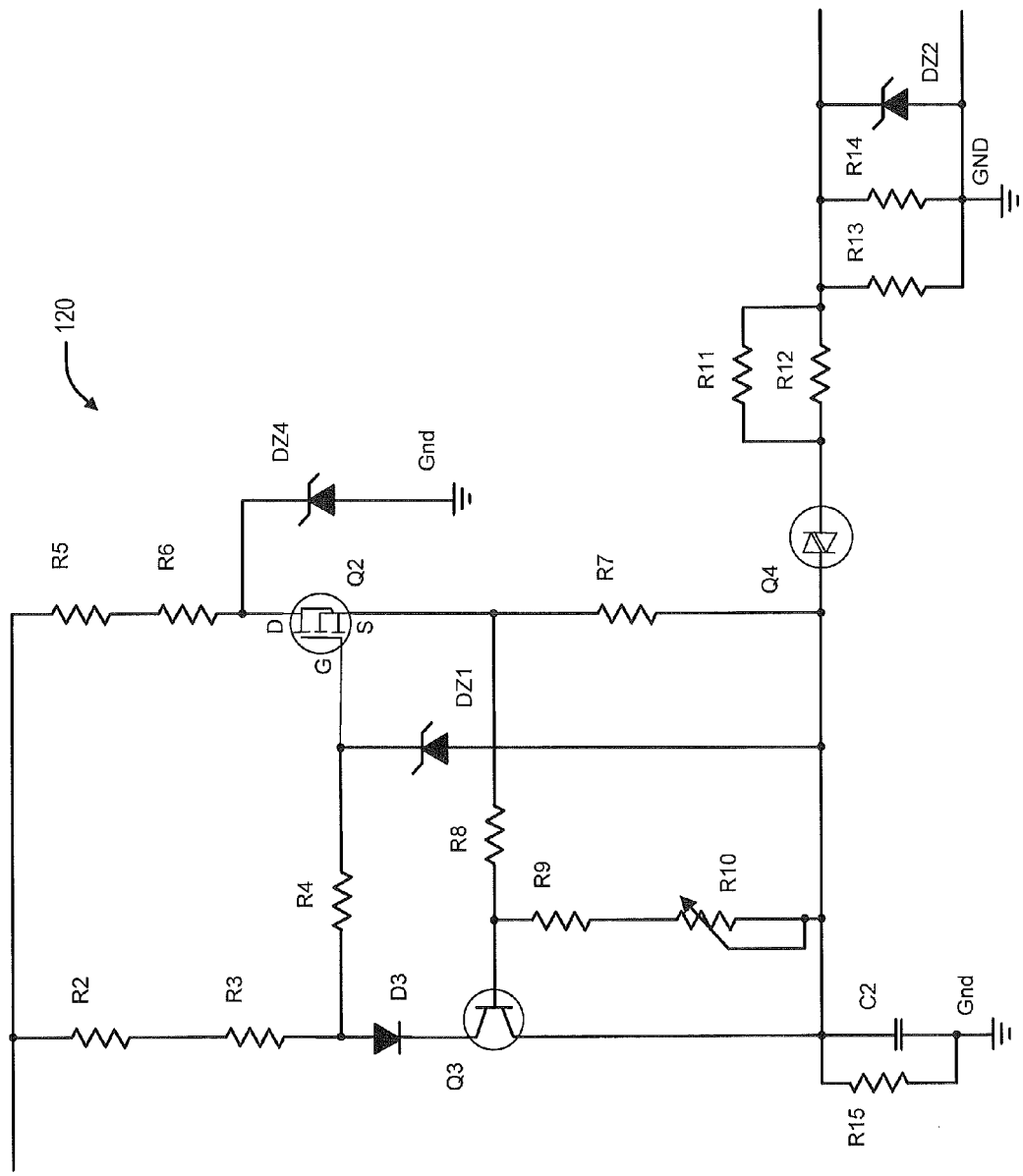
FIG. 9 is a schematic diagram representing a trigger circuit in a crowbar circuit as illustrated in FIGS. 5-8.

Reference is now made to FIG. 9, which is a schematic diagram representing a trigger circuit in a crowbar circuit as illustrated in FIGS. 5-8. During impulse current flow, the trigger circuit 120 senses the residual voltage of the test device 50. In some embodiments, under a DC supply voltage, capacitor C2 may be charged through D1 (FIG. 8) reverse current, which may affect trigger time. The effect may be reduced and/or mitigated by R15, which is connected in parallel with C2. Some embodiments provide that when the voltage across the capacitor C2 exceeds the breakdown voltage of a diode for alternating current (DIAC) Q4, the DIAC Q4 switches to an on-state and a pulse is produced at terminals 22 and 23. By adjusting the charging time of capacitor C2 to the breakdown voltage of the DIAC Q4 to the pre-specified time, Q1 triggering may be controlled.

Control of the time delay may depend on the value of the current flowing to capacitor C2. Some embodiments provide that the circuit charging the capacitor C2 may be a two level current regulator.

Still referring to FIG. 9, some embodiments provide that a MOSFET Q2 is biased into conduction by a positive gate voltage from the resistor R4. Current may flow through resistors R5, R6, MOSFET (Q1) and resistor R7, charging the capacitor C2. A voltage drop may be developed across R7 and consequently a voltage between base and emitter of transistor Q3 may be developed. By properly selecting resistors R8, R9 and R10 the transistor may be biased into conduction and the current may flow though diode D3 and transistor Q3. Resistor R2 may be selected according to an input voltage applied at terminal 21 in order for the MOSFET Q2 to be effectively biased. Resistor R5 may be selected in order to limit the current flowing though the drain of the MOSFET Q2 to avoid excessive and potentially damaging current levels. Zener diodes DZ1, DZ2 may be used to prevent failure at the gate of Q2 and Q1, respectively, against excessive voltage. Zener diode DZ4 may prevent failure at the drain of Q2. The time for charging C2, i.e. current flow to C2, may be adjusted by selecting values R8, R9 and R10. In some embodiments, to prevent initial charging of C2, resistor R15 may be connected in parallel to the capacitor C2.

The voltage pulse may be generated to the gate of the thyristor SCR Q1 when capacitor C2 is charged up to exceed the DIAC Q4 breakdown voltage. After the breakdown of the DIAC Q4 current is flowing through resistors R11 and R12 a voltage pulse is produced at terminals 22 and 23, thus thyristor SCR Q1 is triggered to an on state.

Figure 10:
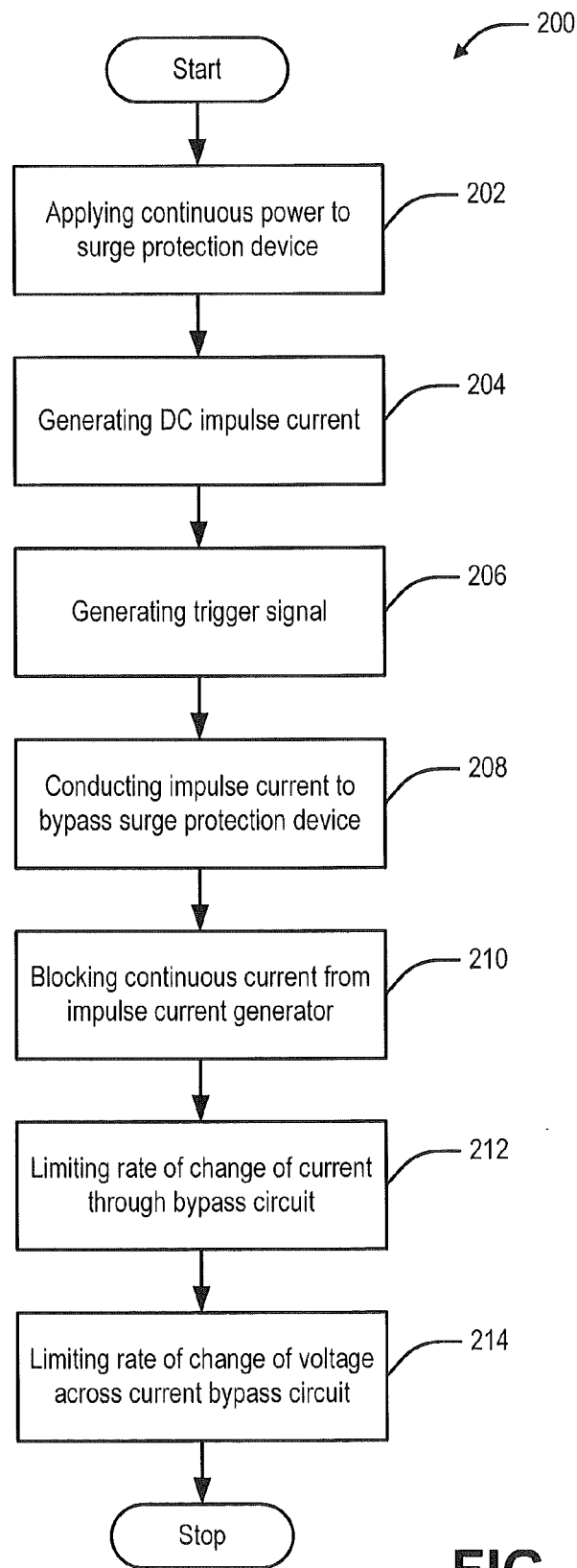
FIG. 10 is a block diagram illustrating operations corresponding to systems, methods and apparatus for testing surge protection devices according to some embodiments of the present invention.

Reference is now made to FIG. 10, which is a block diagram illustrating operations corresponding to systems, methods and apparatus for testing surge protection devices according to some embodiments of the present invention. According to some embodiments, methods 200 for testing a surge protection device may include applying a substantially continuous power to the surge protection device during a test duration (block 202) and generating a direct impulse current (DIC) that corresponds to a specified waveform and applying the DIC to the surge protection device (block 204). In some embodiments, the specified waveform is a 10/350 microsecond current waveform. Some embodiments provide that the surge protection device is a metal oxide varistor and that a maximum value of the DIC is greater than about 1000 amperes.

Some embodiments include generating a trigger signal responsive to a trigger condition that corresponds to a time duration of the DIC applied to the surge protection device (block 206). In some embodiments, the time duration is in a range of about 1.0 ms to about 3.0 ms. Some embodiments provide that the time duration of the DIC applied to the surge protection device is initiated by a voltage across the surge protection device exceeding a voltage threshold.

Some embodiments include conducting a majority portion of the DIC to bypass the surge protection device in response to generating the trigger signal (block 208). For example, once the surge protection device has been exposed to the defined Q and W/R, the remaining portion of the DIC may be bypassed through another current path as provided herein. Some embodiments further include blocking current generated by a continuous current supply from conducting through a impulse current generator (block 210). In this manner, an early or unintentional triggering of the bypass current path may be avoided.

Additionally, some embodiments include limiting a rate of change of current flowing through a current bypass circuit (block 212). In some embodiments, devices in the current bypass circuit may have operational limitations regarding the rate of change of current flowing therethrough. Limiting the rate of change of the current flowing through such devices may prevent exceeding such operational limitations.

In some embodiments, operations may include limiting a rate of a voltage rise across the current bypass circuit (block 214). In some embodiments, devices in the current bypass circuit may have operational limitations regarding the rate of change of voltage applied thereto. Limiting the rate of change of the voltage applied to such devices may prevent exceeding such operational limitations.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A device comprising:
    an impulse current generator that is configured to provide a direct impulse current (DIC) that includes a specified waveform to a test load during a test duration;
    a continuous power supply that is configured to provide a continuous power to the test load during the test duration;
    a trigger circuit that is configured to determine a trigger condition that corresponds to the DIC and to generate a trigger signal responsive to determining the trigger condition; and
    a current bypass circuit that is configured to receive the trigger signal generated by the trigger circuit and to conduct a majority portion of the DIC being conducted by the load responsive to the trigger signal.

2. The device according to claim 1, wherein the specified waveform is a 10/350 microsecond current waveform.

3. The device according to claim 1, wherein the current bypass circuit comprises a thyristor that includes a gate that is coupled to the trigger circuit and that is configured to receive the trigger signal.

4. The device according to claim 1, wherein the trigger condition corresponds to a given time after the DIC is generated.

5. The device according to claim 4, wherein the given time is in a range of about 1.0 ms to about 3.0 ms.

6. The device according to claim 4, wherein the given time is in a range of about 1.8 ms to about 2.3 ms.

7. The device according to claim 4, wherein the given time is about 2.0 ms.

8. The device according to claim 1, wherein the test load comprises a surge protection device, and wherein a maximum value of the DIC is greater than about 1000 amperes.

9. The device according to claim 8, wherein the surge protection device comprises a metal oxide varistor.

10. The device according to claim 1, wherein the trigger circuit is further configured to determine the trigger condition based on a voltage across the test load.

11. The device according to claim 1, wherein the trigger circuit comprises:
    a voltage sensor that is configured to estimate a residual voltage across the test load that exceeds a threshold voltage;
    a time delay control configured to generate an elapsed time signal after the residual voltage has exceeded the threshold voltage for a given time delay; and
    a voltage pulse generator that is configured to generate a voltage pulse that is received by the current bypass circuit as the trigger signal.

12. The device according to claim 1, further comprising a blocking diode between the impulse current generator and the test load to block current generated by the continuous current supply from conducting through the impulse current generator.

13. The device according to claim 1, further comprising:
    a current rate limiter that is connected in series with the current bypass circuit and that is that is configured to limit the rate of change of current flowing through the current bypass circuit; and
    a voltage rate limiter that is connected in parallel with the current bypass circuit and that is configured to limit the rate of a voltage rise across the current bypass circuit.

14. A method for testing a surge protection device, the method comprising:
    applying a substantially continuous power to the surge protection device during a test duration;
    generating a direct impulse current (DIC) that corresponds to a specified waveform and applying the DIC to the surge protection device;
    generating a trigger signal responsive to a trigger condition that corresponds to a time duration of the DIC applied to the surge protection device; and
    conducting a majority portion of the DIC to bypass the surge protection device in response to generating the trigger signal.

15. The method according to claim 14, wherein the specified waveform is a 10/350 microsecond current waveform.

16. The method according to claim 14, wherein the time duration is in a range of about 1.0 ms to about 3.0 ms.

17. The method according to claim 14,
    wherein the surge protection device comprises a metal oxide varistor, and
    wherein a maximum value of the DIC is greater than about 1000 amperes.

18. The method according to claim 14, wherein the time duration of the DIC applied to the surge protection device is initiated by a voltage across the surge protection device exceeding a voltage threshold.

19. The method according to claim 14, further comprising blocking current generated by a continuous current supply from conducting through a impulse current generator.

20. The method according to claim 14, further comprising:
    limiting a rate of change of current flowing through a current bypass circuit; and
    limiting a rate of a voltage rise across the current bypass circuit.

21. A device comprising:
    a crowbar circuit connected in parallel with a test load and that is configured to conduct a direct impulse current (DIC) at a given time after the DIC is applied to the test load, the crowbar circuit comprising:
- a thyristor that includes a gate and that is configured to conduct the DIC at the given time responsive to a trigger signal being applied to the gate;
- a trigger circuit that is configured to sense a voltage across the thyristor and to generate the trigger signal to be received at the gate of the thyristor;
- a first blocking diode that is connected between the thyristor and the test load and that is configured to block alternating current (AC) voltage from conducting through the crowbar circuit; and
- a second blocking diode that is connected in series with the thyristor and that is configured to block a recharging current to impulse current generator capacitors during a discharge of the impulse current.

22. The device according to claim 21, wherein the crowbar circuit further comprises:
- a current rate limiter that is connected in series with the thyristor and that is that is configured to limit the rate of change of current flowing through the thyristor; and
- a voltage rate limiter that is connected in parallel with the thyristor and that is configured to limit the rate of a voltage rise across the thyristor.

23. The device according to claim 21,
wherein the test load comprises a metal oxide varistor, and
wherein a maximum value of the DIC is greater than about 1000 amperes.

24. The device according to claim 21, wherein the trigger circuit comprises:
- a voltage sensor configured to estimate a residual voltage across the thyristor that exceeds a threshold voltage;
- a time delay control configured to generate an elapsed time signal after the residual voltage has exceeded the threshold voltage for a given time delay; and
- a voltage pulse generator that is configured to generate a voltage pulse that is received by the thyristor as the trigger signal.

\* \* \* \* \*

UNITED STATES PATENT AND TRADEMARK OFFICE
CERTIFICATE OF CORRECTION

PATENT NO. : 9,229,048 B2
APPLICATION NO. : 14/024690
DATED : January 5, 2016
INVENTOR(S) : Kostakis et al.

Page 1 of 1

It is certified that error appears in the above-identified patent and that said Letters Patent is hereby corrected as shown below:

In the Claims:
Column 13, Claim 22, Line 20: Please correct "and that is that is configured"
to read -- and that is configured --

Signed and Sealed this
Nineteenth Day of July, 2016

Michelle K. Lee
*Director of the United States Patent and Trademark Office*